(12) United States Patent
Bai et al.

(10) Patent No.: US 11,706,878 B2
(45) Date of Patent: Jul. 18, 2023

(54) MULTILAYER CIRCUIT BOARD

(71) Applicant: INNOGRIT TECHNOLOGIES CO., LTD., Shanghai (CN)

(72) Inventors: Yanwen Bai, Shanghai (CN); Shiann-Ming Liou, Shanghai (CN); Gang Zhao, Shanghai (CN); Lin Chen, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 20 days.

(21) Appl. No.: 17/351,664

(22) Filed: Jun. 18, 2021

(65) Prior Publication Data

US 2022/0217851 A1 Jul. 7, 2022

(30) Foreign Application Priority Data

Jan. 6, 2021 (CN) .......................... 202110012964.8

(51) Int. Cl.
*H05K 1/02* (2006.01)
*H05K 1/03* (2006.01)
(Continued)

(52) U.S. Cl.
CPC ......... *H05K 3/4688* (2013.01); *H05K 1/0251* (2013.01); *H05K 1/116* (2013.01);
(Continued)

(58) Field of Classification Search
CPC ... H05K 1/02; H05K 1/03; H05K 1/11; H05K 1/16; H05K 1/113; H05K 1/115;
(Continued)

(56) References Cited

U.S. PATENT DOCUMENTS 4,963,697 A * 10/1990 Peterson .............. H05K 1/0207
361/767
5,142,775 A * 9/1992 Wiley .................... H05K 3/462
156/89.18
(Continued)

FOREIGN PATENT DOCUMENTS

CN 1913744 A 2/2007
CN 102364681 A 2/2012
(Continued)

*Primary Examiner* — Xiaoliang Chen
(74) *Attorney, Agent, or Firm* — Womble Bond Dickinson (US) LLP

(57) ABSTRACT

The present disclosure discloses a multilayer circuit board comprising a plurality of metal layers, a blind via and/or a buried via, the multilayer circuit board is capable of transmitting signal between the different metal layers. The blind via has a pad on a non-opening side of the blind via. An upper or lower layer metal layer on the non-opening side of the blind via adjacent to the blind via has a first hole which is located in a position corresponding to the pad on the non-opening side of the blind via in a depth direction of the blind via; and/or an upper and/or lower layer adjacent to the buried via has a second hole which is located in a position corresponding to the pad of an upper and/or lower orifice of the buried via in a depth direction of the buried via.

10 Claims, 2 Drawing Sheets

(51) Int. Cl.
*H05K 1/11* (2006.01)
*H05K 1/16* (2006.01)
*H05K 3/40* (2006.01)
*H05K 3/42* (2006.01)
*H05K 3/44* (2006.01)
*H05K 3/46* (2006.01)
*H01L 23/15* (2006.01)
*H01L 23/31* (2006.01)
*H01L 23/48* (2006.01)
*H01L 23/498* (2006.01)
*H01L 23/538* (2006.01)
*H05K 3/00* (2006.01)

(52) U.S. Cl.
CPC ... *H05K 3/0094* (2013.01); *H05K 2201/0959* (2013.01); *H05K 2201/09518* (2013.01)

(58) Field of Classification Search
CPC ........ H05K 1/116; H05K 1/0251; H05K 3/40; H05K 3/42; H05K 3/44; H05K 3/46; H05K 3/428; H05K 3/445; H05K 3/462; H05K 3/4602; H05K 3/4655; H05K 3/4688; H05K 3/0094; H01L 23/15; H01L 23/31; H01L 23/48; H01L 23/481; H01L 23/498; H01L 23/538
USPC .......... 174/255, 260, 262, 264; 29/830, 831, 29/846, 852
See application file for complete search history.

(56) References Cited

U.S. PATENT DOCUMENTS

| | | | | |
|---|---|---|---|---|
| 5,699,613 A * | 12/1997 | Chong | ............... | H05K 1/113 430/314 |
| 6,020,562 A | 2/2000 | Burns et al. | | |
| 8,890,628 B2 * | 11/2014 | Nair | ............... | H01L 23/552 257/416 |
| 9,401,350 B1 * | 7/2016 | We | ............... | H01L 21/4846 |
| 10,555,424 B1 * | 2/2020 | Wu | ............... | H01L 23/5384 |
| 11,018,083 B2 * | 5/2021 | Hung | ............... | H01Q 1/2283 |
| 11,282,761 B2 * | 3/2022 | Wu | ............... | H01L 23/5384 |
| 2001/0027875 A1 * | 10/2001 | Kim | ............... | H05K 3/4652 174/255 |
| 2002/0108776 A1 * | 8/2002 | Uchikawa | ............ | H05K 3/4688 174/255 |
| 2003/0102151 A1 * | 6/2003 | Hirose | ............... | H05K 3/403 174/250 |
| 2004/0124535 A1 * | 7/2004 | Chang | ............... | H01L 21/486 438/678 |
| 2005/0016768 A1 * | 1/2005 | Zollo | ............... | H05K 3/4623 174/262 |
| 2005/0039950 A1 * | 2/2005 | Chan | ............... | H01L 25/0652 174/262 |
| 2005/0178585 A1 * | 8/2005 | Kim | ............... | H05K 1/115 174/262 |
| 2005/0236177 A1 * | 10/2005 | Inagaki | ............... | H05K 1/183 174/255 |
| 2005/0284655 A1 * | 12/2005 | Hsu | ............... | H05K 3/4602 174/258 |
| 2006/0065434 A1 * | 3/2006 | Hsu | ............... | H05K 3/4602 174/262 |
| 2006/0243478 A1 * | 11/2006 | Inagaki | ............ | H01L 23/49827 257/E23.079 |
| 2007/0186413 A1 * | 8/2007 | Hsu | ............... | H05K 3/4602 29/830 |
| 2007/0230151 A1 * | 10/2007 | Hayashi | ............... | H05K 1/162 361/795 |
| 2008/0011507 A1 * | 1/2008 | Vasoya | ............... | H05K 1/0313 361/748 |
| 2008/0210459 A1 * | 9/2008 | Lin | ............... | H05K 1/0271 174/255 |
| 2008/0210460 A1 * | 9/2008 | Lien | ............... | H05K 1/162 29/847 |
| 2009/0053459 A1 * | 2/2009 | Hirose | ............... | H05K 1/112 428/76 |
| 2009/0102045 A1 * | 4/2009 | Hsu | ............... | H01L 23/50 257/701 |
| 2011/0247208 A1 * | 10/2011 | Ikeda | ............... | H05K 3/4602 29/830 |
| 2014/0097007 A1 * | 4/2014 | Nagai | ............... | H05K 3/4007 174/257 |
| 2014/0124242 A1 * | 5/2014 | Ito | ............... | H01L 23/49822 174/250 |
| 2014/0196939 A1 * | 7/2014 | Nishida | ............... | H05K 3/28 174/261 |
| 2014/0231126 A1 * | 8/2014 | Hunrath | ............... | H05K 3/4069 174/264 |
| 2014/0311772 A1 * | 10/2014 | Mizutani | ............ | H05K 3/4602 174/251 |
| 2015/0027750 A1 * | 1/2015 | Nishida | ............... | H05K 3/3452 174/250 |
| 2015/0334837 A1 * | 11/2015 | Nishida | ............... | H01L 23/498 174/251 |
| 2017/0094773 A1 * | 3/2017 | Seo | ............... | H05K 3/4602 |
| 2017/0354044 A1 * | 12/2017 | Kurahashi | ............ | H05K 3/4038 |
| 2018/0110133 A1 * | 4/2018 | Iketani | ............... | H01H 85/12 |
| 2020/0205284 A1 * | 6/2020 | Shin | ............... | H05K 1/115 |
| 2020/0245461 A1 * | 7/2020 | Kaibuki | ............... | H05K 1/115 |
| 2020/0315002 A1 * | 10/2020 | Nakamura | ............ | H05K 3/4652 |
| 2020/0315009 A1 * | 10/2020 | Nakamura | ............ | H05K 1/0271 |
| 2020/0315011 A1 * | 10/2020 | Nakamura | ............ | H05K 3/4644 |
| 2020/0315012 A1 * | 10/2020 | Nakamura | ............ | H05K 3/4652 |
| 2020/0315013 A1 * | 10/2020 | Nakamura | ............ | H05K 3/4652 |
| 2022/0051972 A1 * | 2/2022 | Kim | ............... | H01L 21/4857 |
| 2022/0148942 A1 * | 5/2022 | Kim | ............... | H01L 23/15 |
| 2022/0165650 A1 * | 5/2022 | Kim | ............... | H01L 23/49838 |

FOREIGN PATENT DOCUMENTS

| | | |
|---|---|---|
| CN | 105517327 A | 4/2016 |
| CN | 106100662 A | 11/2016 |
| CN | 109585452 A | 4/2019 |
| CN | 111742622 A | 10/2020 |
| JP | 01308036 A | 12/1989 |

* cited by examiner

MULTILAYER CIRCUIT BOARD

CROSS-REFERENCE TO RELATED APPLICATION

This patent application claims priority, under 35 U.S.C. § 119, of Chinese Patent Application No. 202110012964.8, filed Jan. 6, 2021, which is incorporated by reference in its entirety.

TECHNICAL FIELD

The present disclosure relates to the communication technology field, and specifically to a multilayer circuit board.

BACKGROUND

With the approach of the era of big data, the demand for data increases with each passing day. The data transmission speed is getting faster and the frequency is getting higher. The data is approximately transmitted from a chip to a substrate or a PCB (printed circuit board) through wire bonding or bumping, arrived at a corresponding device side. Currently, for example, PCIe Gen4/Gen5 (the fourth generation/fifth generation high-speed serial computer extended bus port standard), with transmission speed up to 16 Gbps/32 Gbps, poses a constant challenge to signal integrity of the circuit board.

The resistance encountered by signal transmission on a circuit board is called characteristic impedance. When a digital signal is transmitted on the circuit board, the characteristic impedance value of circuit board needs to match the electronic impedance of head to tail components, otherwise superfluous reflection, dissipation, attenuation or delay may be incurred in the transmitted signal energy, resulting in poor signal integrity. When designing a high-speed compact product, blind and buried vias sometimes will be used for the substrate or PCB to complete a layout design. A Parasitic capacitance exists at vias (mainly including blind and buried vias) of the circuit board. On the substrate or PCB, the larger via pad may significantly increase the parasitic capacitance as the transmission speed of signal is increasing, which affects control of value of the characteristic impedance. The increase in the parasitic capacitance may cause a delay in signal rise.

As shown in FIG. 1, in a six-layer circuit board shown in the prior art, the vias can include a blind via 13 and buried vias 11, 12. Blind via 13 has pads 8 on the non-opening side and buried vias 11, 12 have pads 8 on upper and lower orifices. Larger-sized blind and buried vias and pads may result in larger parasitic capacitance, exert a delaying effect on the rise of high-speed signals, and at the same time incur a larger range of impedance misalignment.

Currently, there are two main options to reduce the parasitic capacitance of signals at vias. The first option is adopting small-sized blind and buried vias, which is not only costly but also may affect a yield of circuit board production due to limitation of the process. The second option is using a reverse pad, which has a disadvantage of increasing thickness of board layers, especially for the vias passing through at least three metal layers, and the increased thickness of board layers may exceed the requirements of the height of the circuit board or the height of the product which applies the circuit board, thereby restricting the usage thereof.

SUMMARY

In order to reduce the parasitic capacitance of the circuit board and optimize the signal integrity in high-speed signal transmission, the present disclosure discloses a multilayer circuit board design that can reduce the parasitic capacitance of the signal transmission through the vias.

The multilayer circuit board provided in the present disclosure comprises a plurality of metal layers. The multilayer circuit board includes a blind via and/or a buried via and can transmit signal between the different metal layers through a metal line of the metal layer and the blind via or buried via, wherein the blind via has a pad on a non-opening side of the blind via and the buried via has pads on an upper orifice and a lower orifice thereof.

An upper or lower metal layer on the non-opening side of the blind via adjacent to the blind via has a first hole which is located in a position corresponding to the pad on the non-opening side of the blind via in a depth direction of the blind via; and/or an upper and/or lower metal layer adjacent to the buried via has a second hole which is located in a position corresponding to the pad of the upper orifice and/or the lower orifice of the buried via in a depth direction of the buried via.

In at least one embodiment, a surface perpendicular to the depth direction of the blind via or the buried via is taken as a projection surface.

A projection of the first hole completely covers a projection of the pad on the non-opening side of the blind via on the projection surface; and/or a projection of the second hole completely covers a projection of the pad on the upper orifice or lower orifice of the buried via on the projection surface.

In at least one embodiment, a surface perpendicular to the depth direction of the blind via or the buried via is taken as a projection surface.

A projection of the first hole at least partially overlaps with a projection of the pad on the non-opening side of the blind via on the projection surface; and/or a projection of the second hole at least partially overlaps with a projection of the pad on the upper orifice or the lower orifice of the buried via on the projection surface.

In at least one embodiment, the first hole is a single hole or has a plurality of a first sub holes with metal therebetween; and/or the second hole is a single hole or has a plurality of a second sub holes with metal therebetween.

In at least one embodiment, a metal layer having the first hole on the non-opening side of the blind via has a plurality of layers; and/or a metal layer having the second hole above or below the buried vias has a plurality of layers.

In at least one embodiment, the multilayer circuit board comprises a metal layer with the first hole as a single hole and a metal layer with the first hole having a plurality of first sub holes; and/or the multilayer circuit board comprises a metal layer with the second hole as a single hole and a metal layer with the second hole having a plurality of the second sub holes.

In at least one embodiment, the first hole has a round, rectangular or irregular shape; and/or the second hole has a round, rectangular or irregular shape.

In at least one implementation, the multilayer circuit board is configured for using in a solid-state drive, a graphics card, a data center, and a router.

In at least one embodiment, the multilayer circuit board has at least three metal layers.

By perforating on the metal layer above or below the blind via and/or buried via on the circuit board, the multilayer circuit board disclosed in the present disclosure reduces the parasitic capacitance and optimizes integrity of the signal.

DETAILED DESCRIPTION

Exemplary embodiments of the present disclosure are described below with reference to the drawings. It is understood that the detailed description is only used to teach those skilled in the art to implement the present disclosure, and it is neither intended to exhaust all possible implementation modes of the present disclosure, nor to restrict the scope of the present disclosure.

Figure 1:
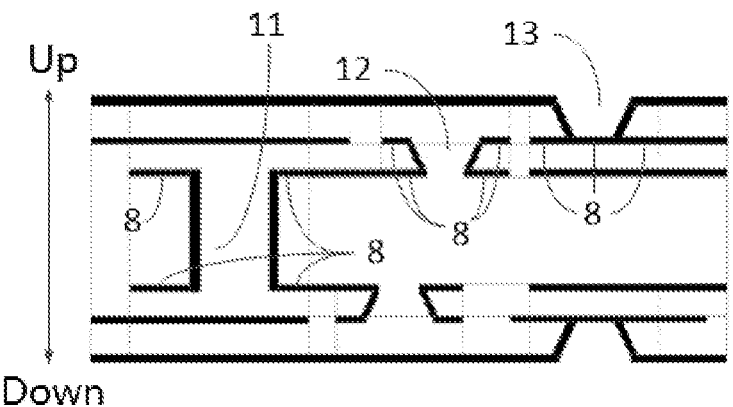
FIG. 1 illustrates a structural schematic view of a multilayer circuit board comprising blind and buried vias in the prior art.

The multilayer circuit board of the present disclosure may include a core board plated with metal layers on both sides. The metal layers can be covered with insulating layers and metal layers sequentially through photolithography and electroplating to expand the number of layers of the metal layers (signal layers). The multilayer circuit board of the present disclosure comprises blind and/or buried vias, and the multilayer circuit board can transmit signals between different metal layers (signal layers) through metal lines of the metal layers and the blind/buried vias. As shown in FIG. 1, the blind vias have pads on the non-opening side, while the buried vias have pads on both sides of the orifices. It should be understood that the openings of the blind vias also have pads, but the present disclosure does not specifically address the pads at the openings of the blind vias, which are not indicated by guide lines in FIG. 1.

The multilayer circuit board of the present disclosure takes the number of layers of the metal layers as the number of layers of the multilayer circuit board, and the present disclosure mainly involves an even number of layers board, e.g. 4 layers, 6 layers, and 8 layers. Certainly, the present disclosure can also be applied for an odd number of layers board of coreless board process, e.g. 3 layers, 5 layers, and 7 layers. As shown in FIGS. 2, 3, 4, and 5, the embodiment of the present disclosure, taking an 8-layer circuit board as an example, a thickness direction, i.e. the vertical direction of the multilayer circuit board of the present disclosure is defined by the depth direction of the buried via. It can be understood that the usage orientation or posture of the circuit board is not limited to that shown in the drawings.

Figure 2:
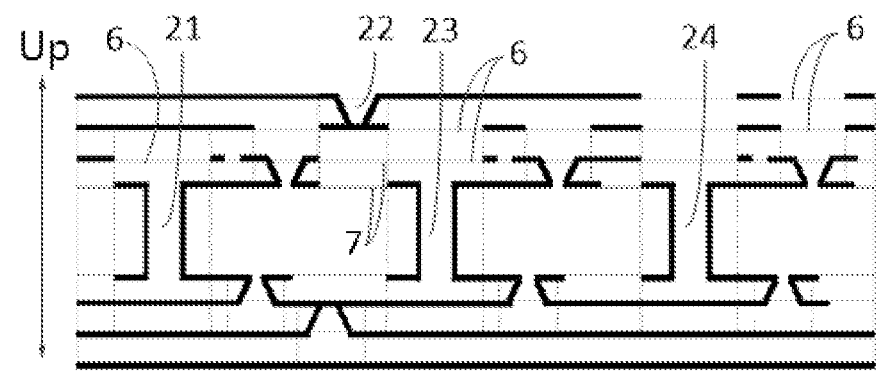
FIG. 2 illustrates a structural schematic view of a multilayer circuit board with first holes on the upper metal layer of the buried vias according to embodiments of the present disclosure.

In the present disclosure, the metal layers on the non-opening sides of the blind vias adjacent to the blind vias have first holes locate corresponding to pads on the non-opening sides of the blind vias in the depth direction of the blind vias. As shown in FIG. 2, the upper or lower metal layer on the non-opening side of a blind via 22 has a first hole 7 which locates corresponding to the pad of the blind via 22. A pad 8 is located on the non-opening side of the blind via 22 and locates corresponding to the position of the first hole 7.

Figure 3:
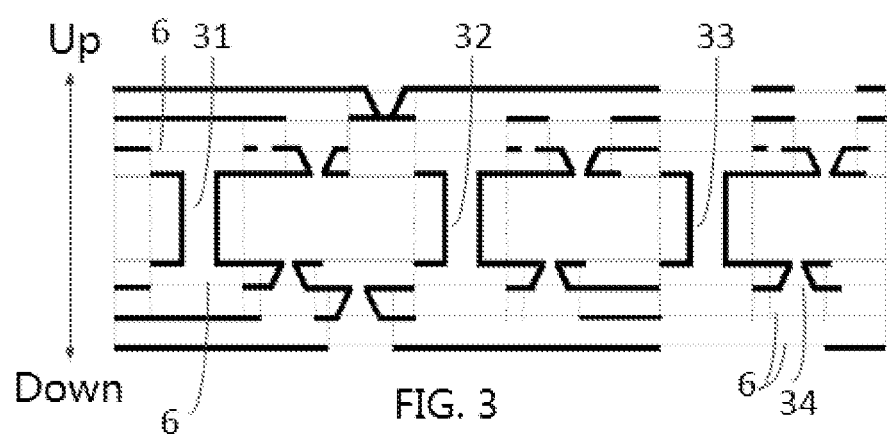
FIG. 3 illustrates a structural schematic view of a multilayer circuit board with first holes on the upper and lower metal layers of the buried vias according to embodiments of the present disclosure.

In the present disclosure, the upper and/or lower metal layer adjacent to the buried via has second holes locate corresponding to pads of the upper and/or lower orifices of the buried vias in the depth direction of the buried via. As shown in FIG. 2, the upper layer adjacent to the buried via 21 has a second hole 6 locates corresponding to the pad at the upper orifice of the buried via 21. As shown in FIG. 3, the upper and lower metal layers adjacent to the buried via 31 have second holes 6, and the second holes of the upper and lower metal layers of the buried via 31 locate corresponding to pads at the upper and lower orifices of the buried via 31.

It can be understood that the width between dotted lines is the diameter of the pad, which is larger than the diameter of the orifice of the blind via or buried via.

The surface perpendicular to the depth direction of the blind or buried via is taken as a projection surface. In one embodiment of the present disclosure, the projection is performed in the depth direction of the blind or buried via, and the projection of the first hole completely covers the projection of the pad at the non-opening of the blind via on the projection surface. The projection of the second hole completely covers the projection of the pad at the upper or lower orifice of the buried via. It can be understood that the outer diameter of the projection of the first or second hole in FIGS. 2, 3, 4, and 5 being equal to the outer diameter of the projection of the pad is only for one embodiment, the projection area of the first or second hole can be larger than that of the pad, and that the projection of the first or second hole completely covering the projection of the pad is a more preferred embodiment.

In one embodiment of the present disclosure, the projection of the first hole can partially overlap the projection of the pad on the non-opening side of the blind via on the projection surface. The projection of the second hole on the projection surface can partially overlap the projection of the pad at the upper or lower orifice of the buried via. That is, the projection of the pad is not completely covered by the projection of the via on the projection surface. It can be understood that the effect of reducing parasitic capacitance in this embodiment is less effective than that in the embodiment where the projection of the via completely covers the projection of the pad. However, compared to the prior art where the metal layer corresponding to the pad has no via (without removing metal), this embodiment is still effective on reducing parasitic capacitance.

The first hole can be a single hole formed in a circular, rectangular, or irregular shape. As shown in FIG. 2, the metal layer on the non-opening side of the blind via 22 has a first hole 7 which is a single hole.

Figure 4:
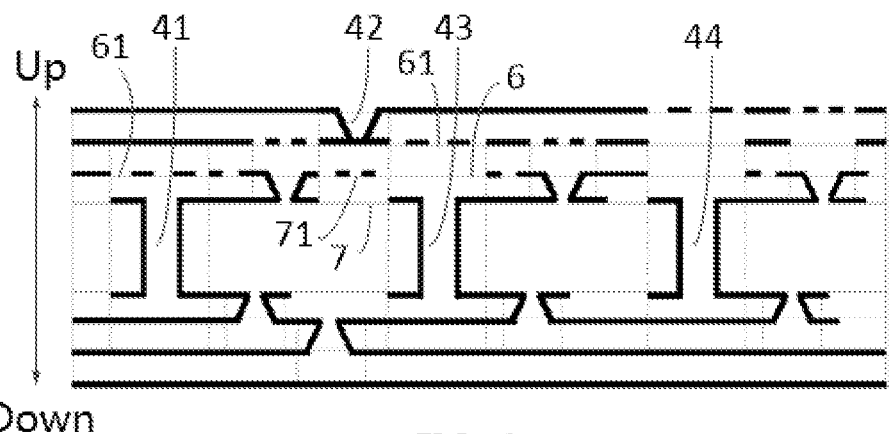
FIG. 4 illustrates a structural schematic view of a multilayer circuit board with a plurality of first sub holes on the upper metal layer of the buried vias according to embodiments of the present disclosure.

The first hole can also have a plurality of first sub holes that are formed in a circular, rectangular, or irregularly shape with metal therebetween. As shown in FIG. 4, the metal layer on the non-opening side of the blind via 42 has a plurality of first sub holes 71.

The second hole can be a single hole that has a circular, rectangular or irregular shape. As shown in FIG. 2, the upper metal layer of the buried via 21 has a second hole 6 which is a single hole.

The second hole can also have a plurality of second sub holes formed in a circular, rectangular, or irregular shape with metal therebetween. As shown in FIG. 4, the upper metal layer of the buried via 41 has a plurality of second sub holes 61.

Compared to a complete hole-digging design, the plurality of sub holes have undigged metal therebetween, weakening the effect of reducing parasitic capacitance, but the plurality of sub holes can reduce parasitic inductance and ground bounce.

Further, the metal layer with the first hole on the non-opening side of the blind via can have a plurality of layers. As shown in FIG. 2, two metal layers below the blind via 22 each have the first hole 7.

Figure 5:
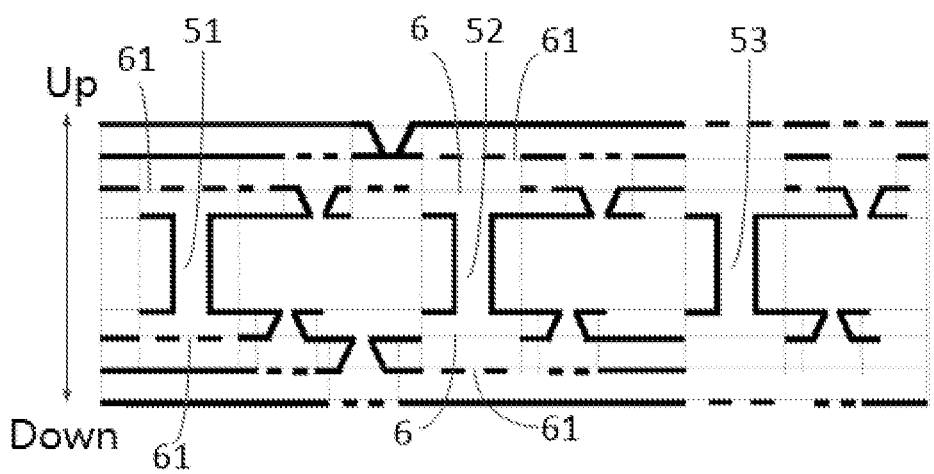
FIG. 5 illustrates a structural schematic view of a multilayer circuit board with a plurality of first sub holes on the upper and lower metal layers of the buried vias according to embodiments of the present disclosure.

Further, the metal layer with the second hole on the upper and/or lower layer of the burned via can have a plurality of layers. As shown in FIG. 2, two metal layers above the buried via 23 each have the second hole 6; three metal layers above the buried via 24 each have the second hole 6; as shown in FIG. 3, two metal layers below the buried via 34 each have the second hole 6; one metal layer above the buried via 31 and one metal layer below the buried via 31 each have the second hole 6; two metal layers above the buried via 32 and two metal layers below the buried via 32 each have the second hole. As shown in FIG. 3, three metal layers above the buried via 33 and three metal layers below the buried via 33 each have the second hole; as shown in FIG. 5, one metal layer above the buried via 51 and one metal layer below the buried via 51 each have a plurality of second sub holes 61.

Further, the multilayer circuit board of the present disclosure may include a metal layer with the first hole as a single hole and a metal layer with the first hole having a plurality of first sub holes. As shown in FIG. 4, there is a metal layer with a plurality of first sub holes 71 below the blind via 42.

Further, the multilayer circuit board of the present disclosure may include a metal layer with the second hole as a single hole and a metal layer with the second hole having a plurality of second sub holes. As shown in FIG. 4, there is a metal layer with a plurality of second sub holes 61 above the buried via 43; as shown in FIG. 4, there are a metal layer with a plurality of second sub holes 61 and two metal layers with a single hole above the buried via 44; as shown in FIG. 5, there are a metal layer with a plurality of second sub holes 61 and a metal layer with a single hole above the buried via 52, and there are also a metal layer with a plurality of second sub holes 61 and a metal layer with a single hole below the buried via 52; as shown in FIG. 5, there are a metal layer with a plurality of second sub holes 61 and two metal layers with a single hole above the buried via 53, and there are also a metal layer with a plurality of second sub holes 61 and two metal layers with a single hole below the buried via 53.

It can be understood that the first hole on the metal layer corresponding to the pad on the non-opening side of the blind via can be a single hole or have a plurality of first sub holes. The corresponding perforated metal layer can be a single layer or have a plurality of layers. The second hole 6 on the metal layer corresponding to the pad at the orifice of the buried via can be a single hole or have a plurality of second sub holes. The corresponding perforated metal layer can be a single layer or have a plurality of layers. The corresponding perforated metal layer can be above or below the buried via, or even both the upper and lower metal layers are perforated. There is no restriction here on the arrangement sequence of the metal layers with a single hole and the metal layers with a plurality of sub holes.

When the perforated metal layer on the same side of the blind or buried via has a plurality of layers, the upper or lower metal layer adjacent to the blind or buried via being a metal layer having and only having a single hole corresponding to the blind or buried via is a preferred embodiment. As shown in FIG. 4, above the buried via 43, the metal layer adjacent to the buried via 43 is a metal layer with a single hole, and the metal layer not adjacent to the buried via 43 is a metal layer with a plurality of second sub holes 61.

It can be understood that the specific provision of the perforation of the metal layer can depend on the calculation of the characteristic impedance in order to meet the matching of the characteristic impedance.

It can be understood that perforating means removing the original metal of the metal layer, and a solution where no metal is provided at this position also belongs to the embodiments of the present disclosure.

It can be understood that the buried vias are filled with resin/metal (not shown) therein and the blind vias are filled with resin/metal (not shown) therein.

The present disclosure reduces the parasitic capacitance without increasing the cost and the height of the circuit board module. The solution of perforating the metal layer with a plurality of sub holes also reduces parasitic inductance and ground bounce. The design of perforating the metal layer enables better matching the characteristic impedance. The present disclosure optimizes the high-speed signal design by improving the metal layer physically.

The multilayer circuit board proposed in the present disclosure can be configured for using in a device that involves high-speed signal transmission, such as a solid-state drive, a graphics card, a data center, and a router.

All the above-mentioned are preferred embodiments of the present disclosure, and it should be noted that for those skilled in the art, improvements and embellishments which should also be considered within the scope of protection of the present disclosure can be made without departing from principles of the present disclosure.

What is claimed is:

1. A multilayer circuit board, comprising:
   a plurality of metal layers, a blind via and a buried via, wherein the multilayer circuit board is configured to transmit signals between different ones of the metal layers through a metal line of the corresponding metal layers and the blind via or the buried via, wherein the blind via includes a pad disposed on a non-opening side of the blind via, and the buried via includes a pad disposed on each of an upper orifice and a lower orifice thereof, wherein
   an upper or lower metal layer on the non-opening side of the blind via that is adjacent to a metal layer including the blind via has a first hole which is located in a position corresponding to the pad on the non-opening side of the blind via and in a depth direction of the blind via, a projection of the first hole completely covers a projection of the pad on the non-opening side of the blind via on a surface perpendicular to the depth direction of the blind via, wherein the first hole has a diameter that is equal to or larger than a diameter of the pad on the non-opening side of the blind via;
   an upper and/or lower metal layer that is adjacent to a metal layer including the buried via has a second hole which is located in a position corresponding to the pad of the upper orifice and/or the lower orifice of the buried via and in a depth direction of the buried via, a projection of the second hole completely covers a projection of the pad on the upper orifice or lower orifice of the buried via on a surface perpendicular to the depth direction of the buried via, wherein the second hole has a diameter that is equal to or larger than a diameter of the pad on the upper orifice and/or the lower orifice of the buried via.

2. The multilayer circuit board according to claim 1, wherein
the first hole is a single hole or has a plurality of first sub holes with metal therebetween.

3. The multilayer circuit board according to claim 1, wherein
a metal layer having the first hole on the non-opening side of the blind via has a plurality of layers.

4. The multilayer circuit board according to claim 2, wherein
the multilayer circuit board comprises a metal layer with the first hole as a single hole and a metal layer with the first hole having a plurality of the first sub holes.

5. The multilayer circuit board according to claim 1, wherein
the first hole has a round, rectangular, or irregular shape; and/or
the second hole has a round, rectangular, or irregular shape.

6. The multilayer circuit board according to claim 1, wherein the multilayer circuit board is configured to be used in at least one of a solid-state drive, a graphics card, a data center, or a router.

7. The multilayer circuit board according to claim 1, wherein the multilayer circuit board has at least three metal layers.

8. The multilayer circuit board according to claim 1, wherein the second hole is a single hole or has a plurality of second sub holes with metal therebetween.

9. The multilayer circuit board according to claim 1, wherein a metal layer having the second hole above or below the buried via has a plurality of layers.

10. The multilayer circuit board according to claim 1, wherein the multilayer circuit board comprises a metal layer with the second hole as a single hole and a metal layer with the second hole having a plurality of second sub holes.

* * * * *